United States Patent
Kawano et al.

(10) Patent No.: US 8,451,022 B2
(45) Date of Patent: May 28, 2013

(54) INTEGRATED CIRCUIT AND INPUT DATA CONTROLLING METHOD FOR RECONFIGURABLE CIRCUIT

(75) Inventors: Tetsuo Kawano, Kawasaki (JP); Takashi Hanai, Kawasaki (JP); Shinichi Sutou, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/802,825

(22) Filed: May 25, 2007

(65) Prior Publication Data

US 2008/0079459 A1 Apr. 3, 2008

(30) Foreign Application Priority Data

Sep. 29, 2006 (JP) ................... 2006-267343

(51) Int. Cl.
*H03K 19/173* (2006.01)
(52) U.S. Cl.
USPC .......................................................... 326/38
(58) Field of Classification Search
USPC .... 326/10, 38–47; 341/100; 708/319; 710/52
See application file for complete search history.

(56) References Cited

U.S. PATENT DOCUMENTS

| | | | | |
|---|---|---|---|---|
| 5,710,550 A | * | 1/1998 | Hsieh et al. | 340/2.26 |
| 6,091,258 A | * | 7/2000 | McClintock et al. | 326/10 |
| 6,260,087 B1 | * | 7/2001 | Chang | 710/100 |
| 6,621,295 B1 | * | 9/2003 | James-Roxby et al. | 326/38 |
| 6,653,859 B2 | * | 11/2003 | Sihlbom et al. | 326/38 |
| 6,963,890 B2 | * | 11/2005 | Dutta et al. | 708/319 |
| 7,091,890 B1 | * | 8/2006 | Sasaki et al. | 341/100 |
| 7,224,184 B1 | * | 5/2007 | Levi et al. | 326/41 |
| 7,474,119 B2 | * | 1/2009 | Kanno et al. | 326/38 |
| 7,822,888 B2 | | 10/2010 | Saito et al. | |
| 7,969,185 B2 | * | 6/2011 | Ogawa | 326/38 |
| 2003/0184339 A1 | | 10/2003 | Ikeda et al. | |
| 2004/0030815 A1 | * | 2/2004 | Shimura et al. | 710/52 |
| 2005/0242835 A1 | * | 11/2005 | Vadi et al. | 326/37 |
| 2006/0004992 A1 | | 1/2006 | Fujisawa et al. | |
| 2007/0073944 A1 | * | 3/2007 | Gormley | 710/72 |

FOREIGN PATENT DOCUMENTS

| | | |
|---|---|---|
| JP | 2004-310730 | 11/2004 |
| JP | 2006-18514 | 1/2006 |
| JP | 2006-18539 | 1/2006 |
| JP | 2006-40254 | 2/2006 |
| WO | WO 02/095946 | 11/2002 |

OTHER PUBLICATIONS

"Japanese Office Action" mailed by JPO and corresponding to Japanese application No. 2006-267343 on Aug. 2, 2011, with English translation.

* cited by examiner

*Primary Examiner* — Crystal L Hammond
(74) *Attorney, Agent, or Firm* — Fujitsu Patent Center

(57) ABSTRACT

An integrated circuit according to the invention includes a reconfigurable circuit including a plurality of computing units interconnected in a reconfigurable manner, and an input data controlling section. The input data controlling section controls input data such that the data is inputted to the reconfigurable circuit in response to a configuration of the reconfigurable circuit.

14 Claims, 13 Drawing Sheets

FIG. 2(A) WAVEFORM 1: 
FIG. 2(B) WAVEFORM 2: 
FIG. 2(C) WAVEFORM 3: 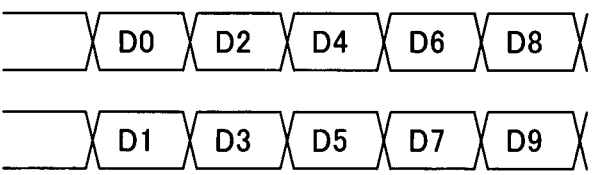

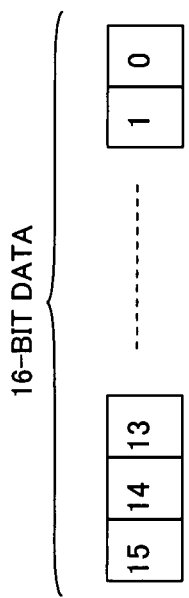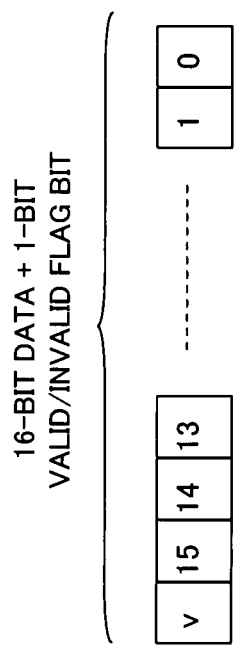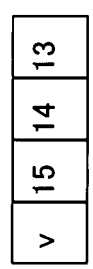
FIG. 4(A)
FIG. 4(B)
FIG. 4(C)

US 8,451,022 B2

INTEGRATED CIRCUIT AND INPUT DATA CONTROLLING METHOD FOR RECONFIGURABLE CIRCUIT

CROSS REFERENCE TO RELATED APPLICATIONS(S)

This application is based on and hereby claims priority to Japanese Application No. 2006-267343 filed on Sep. 29, 2006 in Japan, the contents of which are hereby incorporated by reference.

BACKGROUND OF THE INVENTION

1) Field of the Invention

The present invention relates to an integrated circuit which includes a reconfigurable circuit and an input data controlling method for a reconfigurable circuit.

2) Description of the Related Art

Conventionally, a dynamic reconfigurable LSI is provided wherein a function can be changed over by dynamically changing a circuit configuration of a reconfigurable circuit in an operating state of the circuit.

The reconfigurable LSI includes a reconfigurable circuit wherein a plurality of computing units are arranged in an array and are interconnected by buses extending in vertical and transverse directions. The circuit configuration (network between the computing units) of the reconfigurable circuit can be changed over in a short period of time (for example, in a period of time of 1 clock to several clocks).

For example, in the reconfigurable LSI, by changing over the circuit configuration of the reconfigurable circuit, it is possible to perform an image process on one occasion but perform a process of a voice communication system on another occasion.

In such a reconfigurable LSI as described above, many functions can be implemented by one piece of hardware without providing hardware for exclusive use for the individual functions. In other words, in the reconfigurable LSI, by effectively utilizing finite resources which are determined at the point of time of fabrication of the LSI, an optimum circuit ready for many applications can be implemented.

It is to be noted that, as a result of a prior art search actually conducted, Japanese Patent Laid-Open No. 2006-18539 and a pamphlet of International Publication No. 2002/095946 have been obtained.

Incidentally, where such a simple process that the resources of the reconfigurable circuit are sufficient for the process is performed, the reconfigurable circuit may be set so as to have a predetermined circuit configuration so that the process is performed.

However, where such a complicated process that the resources of the reconfigurable circuit are insufficient for the process is performed (for example, where the data amount to be inputted is great and the throughput is high), it is necessary to dynamically vary the circuit configuration of the reconfigurable circuit. In this instance, if the input timing of the data is not controlled, then there is the possibility that the data may not be processed by the reconfigurable circuit.

On the other hand, depending upon the contents of the process, the reconfigurable circuit may be configured in a circuit configuration composed of a plurality of circuits divided spatially such that the process may be performed parallelly by the circuits. In this instance, if the configuration and the input timing of input data are not controlled, then there is the possibility that the process cannot be performed by the reconfigurable circuit.

In such an instance as just described, although, for example, mapping or the like is contrived to cope with the problem just described, it is demanded to utilize resources more efficiently and to perform mapping more readily.

Incidentally, there is a tendency to try to implement one or plural functions of an ASIC (Application Specific Integrated Circuit) using the reconfigurable technique.

Generally, the ASIC has the following characteristics.

(1) Since hardware is configured so as to be ready for a specific application, the chip size is small.

(2) Since the development cost is high, recovery of the development cost is difficult without producing in large amounts.

(3) Since the period of time for development and the lifetime of the product are long, the risk is higher where it is obliged to perform functional modification or the like during development or after shipment of products.

On the other hand, the reconfigurable LSI has a characteristic that, while it has a performance proximate to that of hardware, the function can be changed also after product shipment.

SUMMARY OF THE INVENTION

Thus, it is studied recently to cover a region in which the ASIC is not suitably applied with a reconfigurable LSI, that is, to incorporate a reconfigurable core (reconfigurable circuit) in an ASIC.

For example, it is studied to implement some components of a conventional ASIC which includes, as shown in FIG. 13(A), hardware IP (Intellectual Property) blocks for exclusive use, random logic blocks, an RISC (Reduced Instruction Set Computer) processor and so forth, that is, hardware IP blocks for exclusive use and a random logic block in a region A surrounded by a thick solid line in FIG. 13(A), using a reconfigurable core as shown in FIG. 13(B). It is to be noted that FIGS. 13(A) to 13(C) illustrate circuit arrangements of an LSI, and an IO region for interface with external circuits is provided around the IP blocks for exclusive use, random logic blocks and RISC.

By placing a reconfigurable core in an ASIC in this manner and changing over the function to be implemented by the reconfigurable core (circuit configuration of the reconfigurable core), a function change or the like is permitted also after shipment of the product.

However, where a reconfigurable core is incorporated in an ASIC, signals (data) to be inputted to the reconfigurable core are inputted from a plurality of places (blocks) [refer to FIG. 13(C)]. In this instance, the throughput of input data may vary depending upon from which one of the blocks the data is supplied. Therefore, it is very difficult to cope with input data from the individual blocks, and a mechanism for a unified input data process is required.

The present invention provides an integrated circuit and an input data controlling method for a reconfigurable circuit which allow input data to be processed with certainty by a reconfigurable circuit.

According to an aspect of the present invention, there is provided an integrated circuit comprising a reconfigurable circuit including a plurality of computing units interconnected in a reconfigurable manner, and an input data controlling section configured to control input data such that the data is inputted to the reconfigurable circuit in response to a configuration of the reconfigurable circuit.

According to another aspect of the present invention, there is provided an input data controlling method for a reconfigurable circuit, comprising extracting a data input pattern which defines an input timing in response to a configuration of a reconfigurable circuit which includes a plurality of computing units interconnected in a reconfigurable manner, and inputting input data to the reconfigurable circuit based on the data input pattern.

With the integrated circuit and the input data controlling method for a reconfigurable circuit, there is an advantage that input data could be processed with certainty by the reconfigurable circuit.

The above and other objects, features and advantages of the present invention will become apparent from the following description and the appended claims, taken in conjunction with the accompanying drawings.

BRIEF DESCRIPTION OF THE DRAWINGS

FIGS. 2(A) to 2(C) are schematic views illustrating waveforms 1 to 3 produced by an input data controlling section of the integrated circuit according to the first embodiment of the present invention, respectively;

FIGS. 4(A) to 4(C) are views illustrating a process by an input data shaping section provided in the integrated circuit according to the first embodiment of the present invention;

DESCRIPTION OF THE PREFERRED EMBODIMENTS

Figure 1:
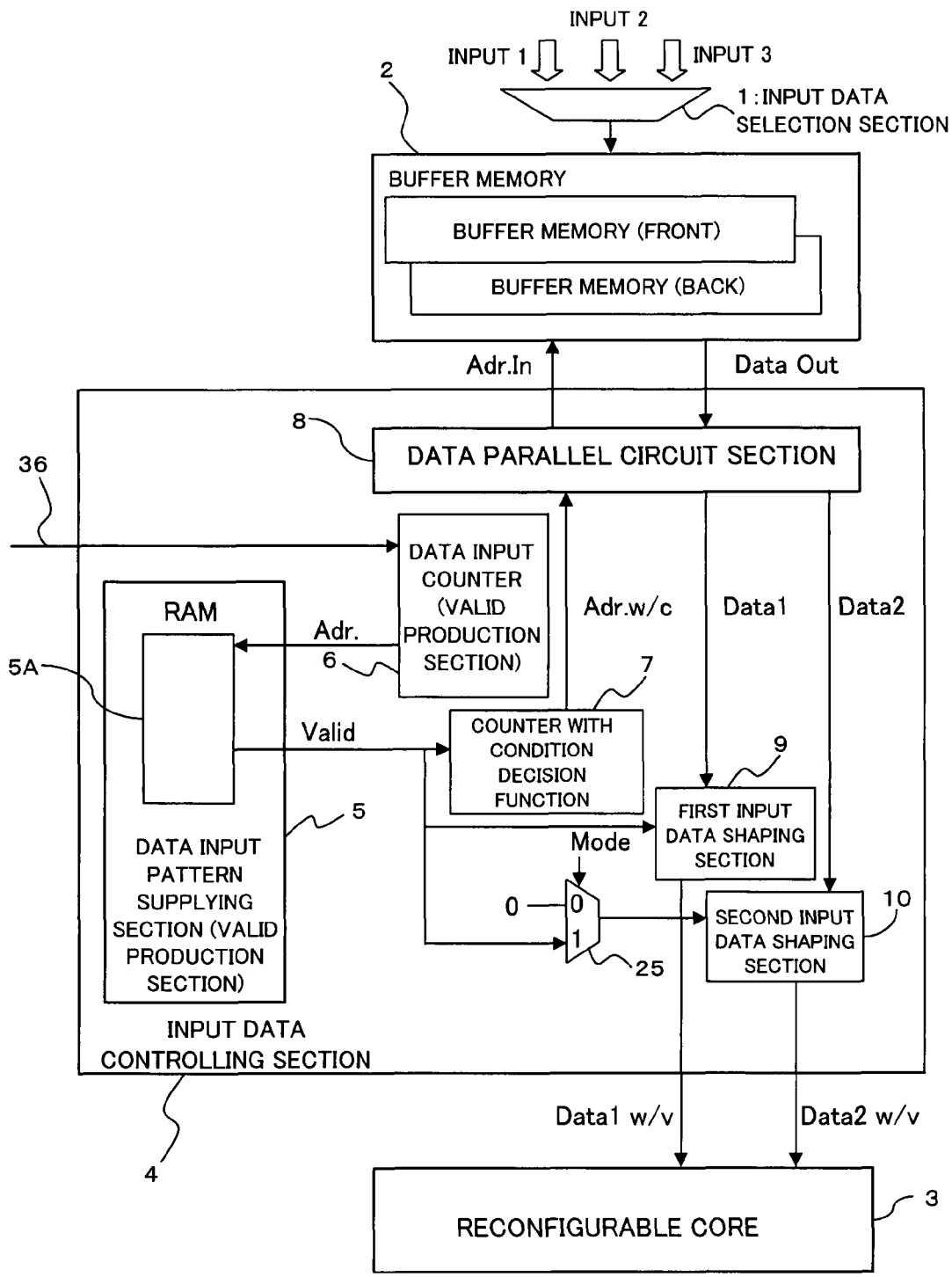
FIG. 1 is a schematic view showing a configuration of an integrated circuit according to a first embodiment of the present invention.

In the following, integrated circuits and input data controlling methods for a reconfigurable circuit according to embodiments of the present invention are described with reference to the drawings.

[First Embodiment]

First, an integrated circuit and an input data controlling method for a reconfigurable circuit according to a first embodiment of the present invention are described with reference to FIGS. 1 to 8.

The integrated circuit according to the present embodiment is a dynamic reconfigurable LSI (dynamically reconfigurable type semiconductor integrated circuit) which includes a reconfigurable circuit including a plurality of computing units interconnected in a reconfigurable manner and can configure a circuit ready for an application program and the circuit configuration can be changed over dynamically (for example, in a period of time of 1 clock to several clocks). For example, the integrated circuit according to the present embodiment is configured as an integrated circuit wherein a reconfigurable core (reconfigurable circuit) is incorporated in an ASIC.

Particularly, in the present integrated circuit, input data to be supplied to the reconfigurable core (configuration and/or input timing of input data) can be controlled at a preceding stage to the reconfigurable core in accordance with the circuit configuration of the reconfigurable core such that input data can be processed by the reconfigurable core.

Here, where such a simple process that the resources of the reconfigurable circuit are sufficient for the process is to be performed, the reconfigurable core may be set so as to have a predetermined circuit configuration and perform the process (process 1: for example, wherein one data is processed in one clock).

On the other hand, where such a complicated process that the resources of the reconfigurable circuit are insufficient for the process is performed, it is necessary to change over the circuit configuration of the reconfigurable core and perform the process (process 2: wherein, for example, one data is processed in two or three clocks; time division process).

Further, also such a case may occur that the reconfigurable core has a circuit configuration constituted by a plurality of circuits divided spatially and a process (process 3: wherein, for example, two data are processed in one clock) can be performed parallel by the circuits.

In order to perform different processes by means of the reconfigurable core, it is necessary to control data to be inputted to the reconfigurable core and/or the input timing in accordance with the contents of the processes (degree of complexity of the processed).

For example, where the process 1 described above is to be performed, the data may be successively inputted in synchronism with a clock 1 (operation clock of the reconfigurable core). Therefore, the input data may be set so as to have such a waveform 1 as shown in FIG. 2(A) such that one data is inputted per one clock.

Where the process 2 is to be performed, the data may be inputted in synchronism with the clock 1 at intervals of time (for example, one to several clocks) corresponding to the period of time for changing over the resource (circuit configuration). Therefore, the input data may be set so as to have such a waveform 2 as shown in FIG. 2(B) such that, for example, one data is inputted per two clocks. It is to be noted that, in FIG. 2(B), a half-tone dot portion indicates invalid data.

Where the process 3 is to be performed, the data may be successively inputted individually to a plurality of ports (here, two ports) of the reconfigurable core in synchronism with the clock 1. Therefore, the input data may be set so as to have such a waveform 3 as seen in FIG. 2(C) such that, for example, one data is inputted per one clock to each of the two ports of the reconfigurable core.

Therefore, for example, as shown in FIG. 1, the present dynamic reconfigurable LSI includes an input data selection section (input signal selection section; for example, selector) 1 for changing over input data (here, one of the inputs 1 to 3) in accordance with the contents of the process (here, one of the process 1 to 3), a buffer memory (buffer) 2 for temporarily retaining the input data, a reconfigurable core (reconfigurable circuit) 3, and an input data controlling section (input data controlling circuit) 4 for controlling the data (configuration and/or input timing of the data) to be inputted to the reconfigurable core 3.

It is to be noted that, here, the input data necessary for the process 1 is determined as the input 1 and the input data necessary for the process 2 is determined as the input 2, and the input data necessary for the process 3 is determined as the input 3. All of the input data may be supplied from one of the blocks of the ASIC or from plural ones of the blocks.

Then, the input data controlling section 4 extracts the input data retained by the buffer memory 2 and sets the input data individually so as to have such a desired waveform corresponding to the circuit configuration of the reconfigurable core 3 (in particular, converts the format of the input data into an input data format which can be processed by the reconfigurable core). Thereafter, the converted input data is supplied (inputted) to the reconfigurable core 3.

Here, for example, as shown in FIG. 1, the buffer memory 2 has a two-face configuration including a front buffer memory and a back buffer memory, and the data inputted from the outside of the reconfigurable core 3 is written into one of the front and back buffer memories and is read out from the other one of the front and back buffer memories. Here, if writing of data into one of the buffer memories ends and readout of data from the other one of the buffer memories ends, then changeover between the buffer memories is performed.

Then, the input data controlling section 4 reads out the input data retained by the one of the buffer memories based on an address signal (address value) produced using a data input pattern as hereinafter described.

For example, as shown in FIG. 1, the input data controlling section 4 includes a data input pattern supplying section 5, a data input counter 6, a counter 7 with a condition decision function, a data parallel circuit section 8, a first input data shaping section (first input data shaping circuit) 9, a second input data shaping section (second input data shaping circuit) 10, and a selector 25.

Here, the data input counter 6 performs counting up from 0 to an arbitrary value. By the data input counter 6, an address signal (valid information extraction address value; pattern extraction address value) [Adr.] for accessing a RAM 5A as the data input pattern supplying section 5 is produced. Then, as shown in FIG. 1, the count value (address signal; address value) [Adr.] of the data input counter 6 is supplied to the RAM 5A as the data input pattern supplying section 5.

The data input pattern supplying section 5 supplies a data input pattern [information for setting the input data so as to have a desired waveform [one of the waveforms 1 to 3 in FIGS. 2(A) to 2(C)]; input timing information] for defining an input timing corresponding to the circuit configuration of the reconfigurable core 3. Here, the data input pattern is used to determine at what input timing the data is to be read out from the buffer memory 2 and inputted to the reconfigurable core 3.

In the present embodiment, as shown in FIG. 1, the data input pattern supplying section 5 is configured from the random access memory (RAM) 5A.

Here, valid information [Valid] (valid signal; valid data) is stored in relationship to an address in the RAM 5A as the data input pattern supplying section 5.

Here, the valid information [Valid] is flag information (flag signal indicating whether or not the data is supplied) which indicates whether or not the data is valid. Here, the data input pattern is configured by arbitrarily combining a plurality of pieces of valid information [Valid] to produce a valid information string (valid signal string; valid data string). In particular, the valid information string stored in the RAM 5A as the data input pattern supplying section 5 is data for determining a data input pattern.

For example, where the data is inputted to the reconfigurable core 3 every one clock [waveform 1 in FIG. 2(A) or waveform 3 in FIG. 2(C)], the data may be stored in order like 1, 1, . . . 1, 1 at address 0, address 1, . . . , address $2n$, and address $2n+1$ (n indicates a positive integer) of the RAM 5A, respectively. Further, where the data is inputted to the reconfigurable core 3 every two clocks [waveform 2 in FIG. 2(B)], the data may be stored in order like 1, 0, . . . , 1, 0 at address 0, address 1, . . . , address $2n$, and address $2n+1$ of the RAM 5A, respectively.

It is to be noted that the data stored in the RAM 5A as the data input pattern supplying section 5 can be controlled from the outside (for example, a CPU) and can be changed in accordance with the circuit configuration of the reconfigurable core 3.

Such a configuration as described above is particularly suitable for a case wherein input timings are complicated or input timings have no periodicity.

Then, if the count value (address value) [Adr.] of the data input counter 6 is supplied to the RAM 5A as the data input pattern supplying section 5, then the RAM 5A supplies a valid signal [Valid] to the counter 7 with a condition decision function.

In this manner, as the valid signal [Valid] is supplied in order in response to the count value (address value) [Adr.] of the data input counter 6, the data input pattern configured from the valid signal [Valid] is supplied to the counter 7 with a condition decision function.

It is to be noted that, since the valid signal [Valid] is produced by the data input counter 6 and the RAM 5A as the data input pattern supplying section 5 (which are hereinafter referred to collectively as data input pattern supplying circuit), they are sometime referred to also as Valid production section (Valid production circuit).

The counter 7 with a condition decision function performs counting up where the valid signal [Valid] supplied from the RAM 5A as the data input pattern supplying section 5 indicates "1" (which indicates that the data is valid). As shown in FIG. 1, by the counter 7 with a condition decision function, an address signal (input data readout address value) [Adr.w/c] for reading out input data [Data Out] from the buffer memory 2 is produced based on the valid signal [Valid] (data input pattern) readout from the RAM 5A. Therefore, the counter 7 with a condition decision function is sometime referred to also as address production section.

In order to set the input data mainly so as to have such a waveform 3 as described above, the data parallel circuit section 8 divides the input data [Data Out] in parallel (in particular, controls the configuration of the input data) and supplies the input data [Data Out] as input data [Data1] and [Data2] to the first input data shaping section 9 and the second input data shaping section 10, respectively, as seen in FIG. 1.

Figure 3:
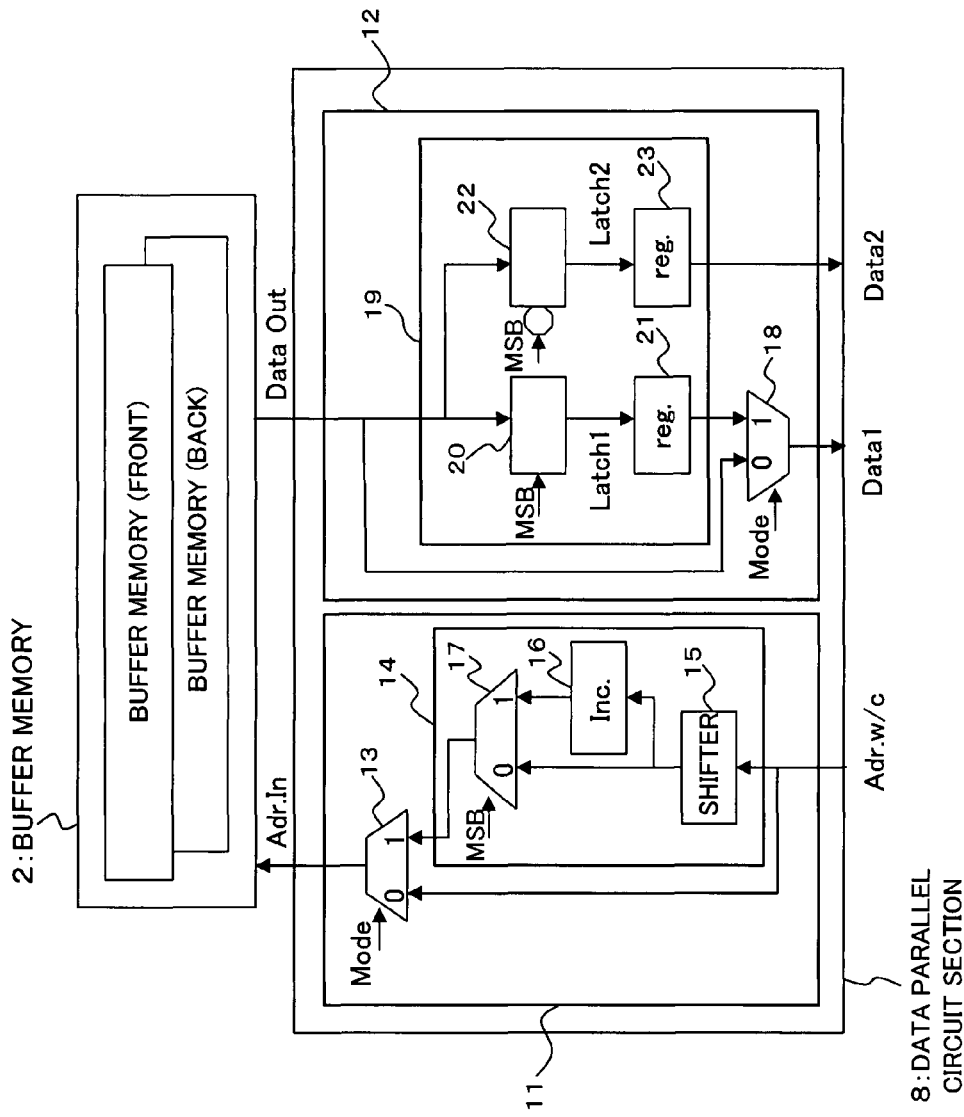
FIG. 3 is a schematic view showing a configuration of a data parallel circuit section of the integrated circuit according to the first embodiment of the present invention.

As seen in FIG. 3, the data parallel circuit section 8 includes an input circuit section 11 for supplying the count value (address value, address signal) [Adr.w/c] supplied from the counter 7 with a condition decision function as an address signal [Adr. In] to the buffer memory 2, and an output circuit section 12 for supplying the input data [Data Out] supplied from the buffer memory 2 as the input data [Data1] and [Data2] to the first input data shaping section 9 or the first and second input data shaping sections 9 and 10.

Here, for example, as seen in FIG. 3, the input circuit section 11 of the data parallel circuit section includes a selector (first selector) 13 for selecting one of an address value for accessing the buffer memory 2 when the input data is set so as to have the waveform 1 or the waveform 2 and another address value for accessing the buffer memory 2 when the input data is set so as to have the waveform 3, and an address production circuit section 14 for producing the address value [Adr.In] to be supplied to the buffer memory 2 when the input data is set so as to have the waveform 3.

Here, the address production circuit section 14 converts the address signal [Adr.w/c] supplied from the counter 7 with a condition decision function into an address signal having a doubled frequency.

For example, as seen in FIG. 3, the address production circuit section 14 includes a shifter 15 for shifting the address value [Adr.w/c] supplied from the buffer memory 2 by one bit to the left, an adder 16 for adding [1] to the address value supplied from the shifter 15, and a selector (second selector) 17 for selecting one of the address value supplied from the shifter 15 and the address value supplied from the adder 16.

Where the input data is set so as to have the waveform 1 or the waveform 2, by the input circuit section 11 of the data parallel circuit section 8 configured in such a manner as described above, the address value [Adr.w/c] supplied from the counter 7 with a condition decision function is supplied as it is as the address value (address signal) [Adr.In] to the buffer memory 2.

On the other hand, where the input data is set so as to have the waveform 3, by the input circuit section 11 of the data parallel circuit section 8, the address signal [Adr.w/c] supplied from the counter 7 with a condition decision function is converted into an address signal having the doubled frequency and the converted address signal is supplied as the address value (address signal) [Adr.In] to the buffer memory 2.

It is to be noted that the reason why the input circuit section 11 for converting the address signal [Adr.w/c] into the address signal [Adr.In] having the doubled frequency in this manner is provided is that it is intended to output the input data [Data1] and [Data2] from the output circuit section 12 in synchronism with the operation clock (clock 1) of the reconfigurable core 3.

On the other hand, for example, as shown in FIG. 3, the output circuit section 12 of the data parallel circuit section 8 includes a selector (third selector) 18 for selecting data to be outputted as the input data [Data1] in a case wherein the input data is set so as to have the waveform 1 or the waveform 2 and another case wherein the input data is set so as to have the waveform 3, and a data production circuit section 19 for producing the input data [Data1] and [Data2] to be supplied to the first input data shaping section 9 and the second input data shaping section 10, respectively, where the input data is set so as to have the waveform 3.

Here, the data production circuit section 19 converts the input data [DataOut] supplied from the buffer memory 2 into the two input data [Data1] and [Data2].

For example, as seen in FIG. 3, the data production circuit section 19 includes a first latch 20 for passing only the data to be supplied to the first input data shaping section 9 from within the input data [Data Out] supplied from the buffer memory 2, a first register [for example, flip-flop (FF)] 21 for synchronizing data [Latch1] supplied from the first latch 20 with the clock 1, a second latch 22 for passing only the data to be supplied to the second input data shaping section 10 from within the input data [Data Out] supplied from the buffer memory 2, and a second register [for example, flip-flop (FF)] 23 for synchronizing data [Latch2] supplied from the second latch 22 with the clock 1.

Where the input data is set so as to have the waveform 1 or the waveform 2, the output circuit section 12 of the data parallel circuit section 8 configured in such a manner as described above supplies the input data [Data Out] supplied from the buffer memory 2 as it is as the input data [Data1] to the first input data shaping section 9 through the third selector 18.

On the other hand, where the input data is set so as to have the waveform 3, the output circuit section 12 of the data parallel circuit section 8 converts the input data [Data Out] supplied from the buffer memory 2 into the two input data [Data1] and [Data2] and supplies the input data [Data1] to the first and second input data shaping sections 9 and 10 through the third selector 18.

It is to be noted that the configuration of the data parallel circuit section 8 is not limited to this, but the data parallel circuit section 8 may be configured such that the input data read out from the buffer memory 2 can be divided in parallel.

As seen in FIG. 1, the first and second input data shaping sections 9 and 10 shape the input data [Data1] and [Data2] by adding the valid information [Valid] (valid signal; valid data; flag information indicating whether or not the data is valid) to the input data [Data1] and [Data2] read out from the buffer memory 2 and supplied through the data parallel circuit section 8 so that the input data [Data1] and [Data2] are outputted as input data [Data1 w/v] and [Data2 w/v], respectively.

For example, where the input data [Data1] (or [Data2]) supplied through the data parallel circuit section 8 has a data width of 16 bits as seen in FIG. 4(A), the first and second input data shaping sections 9 and 10 add one flag bit (valid bit; which indicates that, for example, data is valid where it is "1", or data is invalid where it is "0" indicating whether the data is valid or invalid to the data of 16 bits and supply the data as the input data (input signal) [Data1 w/v] (or [Data2 w/v]) to the reconfigurable core 3.

Here, for example, in the case of such input data [Data1] (or [Data2]) of a binary notation as seen on the upper side of FIG. 4 (C), while the contents of the input data [Data1] (or [Data2] ) are [256], the flag bit (Valid; here, the top bit) is "0". Therefore, the input data [Data1] (or [Data2]) is handled as invalid data.

On the other hand, in the case of such input data [Data1] (or [Data2]) of a binary notation as seen on the lower side of FIG. 4(C), the contents of the input data [Data1] (or [Data2] ) are "−1" (complement of 2) and the valid bit (here, the top bit) is "1". Therefore, the input data [Data1] (or [Data2]) is handled as valid data.

In this manner, the first and second input data shaping sections 9 and 10 add the valid information [Valid] to the input data [Data1] and [Data2] to set the input data as data including valid data and invalid data. Consequently, the input data [Data1] and [Data2] are shaped (in particular, the input timings thereof are controlled) to desired waveforms corresponding to the data input pattern configured from a combination (valid information string) of the valid information [Valid], and the input data [Data1] and [Data2] are outputted as the input data [Data1 w/v] and [Data2 w/v], respectively.

The selector 25 selects the fixed value "0" where the mode [Mode] is "0", but selects the valid information [Valid] supplied from the RAM 5A as the data input pattern supplying section 5 where the mode [Mode] is "1". Here, where the waveforms 1 and 2 in FIGS. 2(A) and 2(B) are set, the mode of the selector 25 is set to "0", but where the waveform 3 in FIG. 2(C) is set, the mode of the selector 25 is set to "1".

Figure 5:
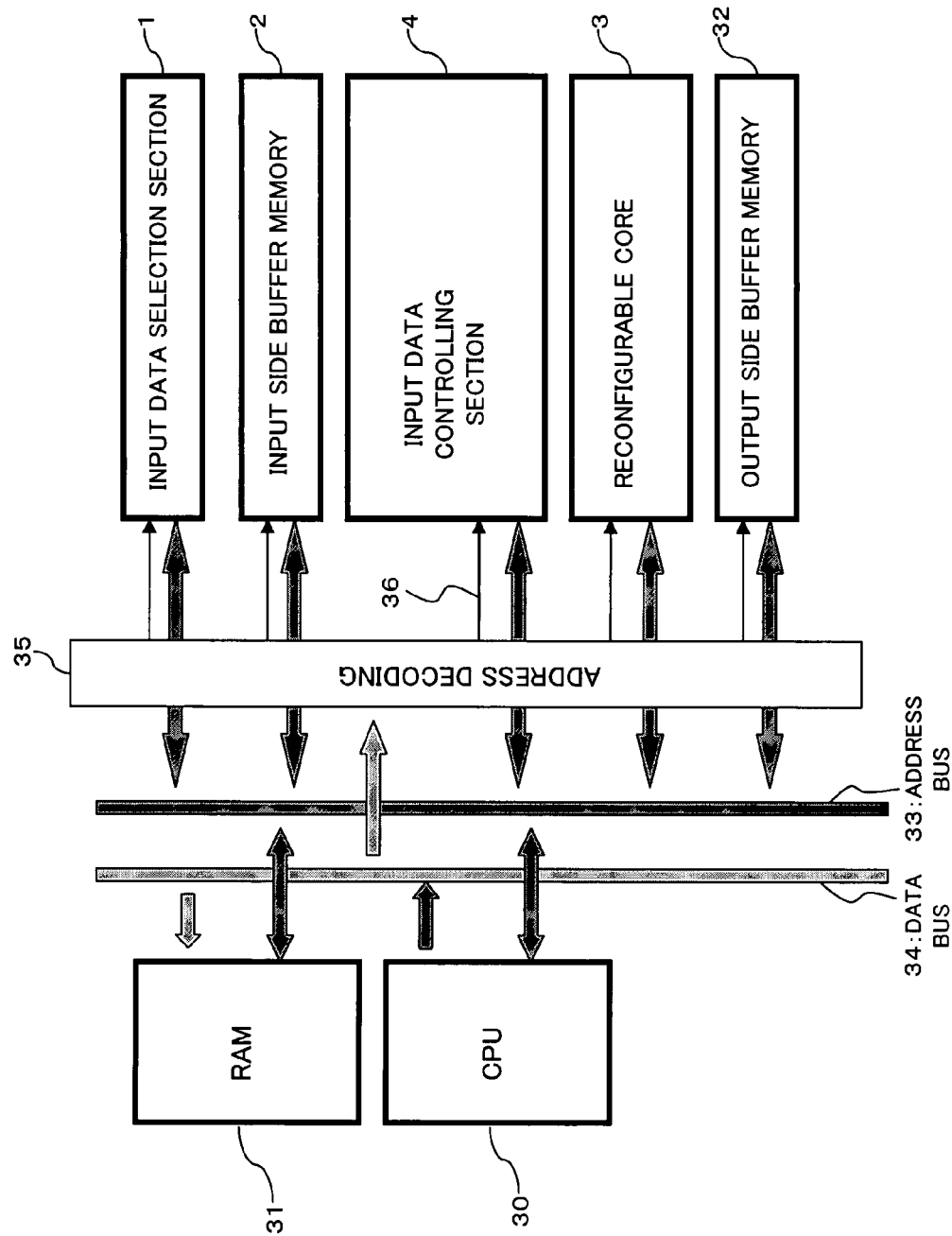
FIG. 5 is a schematic view illustrating a system configuration of the integrated circuit according to the first embodiment of the present invention.

Incidentally, for example, as seen in FIG. 5, in a particular system configuration of the present integrated circuit, not only the input data controlling section 4, input data selection section 1, buffer memory (input side buffer memory) 2 and reconfigurable core 3 described above but also, for example, a CPU (controller; controlling circuit) 30, a RAM (memory, storage section) 31, an output side buffer memory 32, an address bus 33, a data bus 34, an address decoding circuit 35 and so forth are provided.

A controlling method (operation procedure of the present system) of input data for the integrated circuit is described below.

First, the present integrated circuit performs, for example, such a process as described below before control of the input data is performed by the input data controlling section 4.

Configuration data for defining the circuit configuration of the reconfigurable core 3 stored in the RAM 31 is read out based on a command from the CPU 30 and is written into a memory in the reconfigurable core 3. In response to this, the circuit configuration of the reconfigurable core 3 is changed over.

It is to be noted that a circuit configuration wherein it is necessary to set the input data so as to have the waveform 1 is referred to as configuration 1 and another circuit configuration wherein it is necessary to set the input data so as to have the waveform 2 is referred to as configuration 2, and a further circuit configuration wherein it is necessary to set the input data so as to have waveform 3 is referred to as configuration 3.

Further, the data having a desired data input pattern stored in the RAM 31 is read out based on a command from the CPU 30 and is written into the RAM 5A as the data input pattern supplying section 5.

For example, where the circuit configuration of the reconfigurable core 3 is set to the configuration 1 or the configuration 3 (in particular, where the input data is set so as to have the waveform 1 or the waveform 3), the data (data input pattern) in relationship to the flag information (valid signal) [Valid] of 1, 1, . . . , 1, 1 is written in order into address 0, address 1, . . . , address 2n, and address 2n+1 of the RAM 5A as the data input pattern supplying section 5.

Further, for example, the circuit configuration of the reconfigurable core 3 is set to the configuration 2 (in particular, where the input data is set so as to have the waveform 2), the data (data input pattern) in relationship to the flag information (valid information) [Valid] of 1, 0, . . . , 1, 0 is written in order into address 0, address 1, . . . , address 2n, and address 2n+1 of the RAM 5A as the data input pattern supplying section 5.

Further, the mode [Mode] of the selectors 13, 18 and 25 is set based on a command from the CPU 30.

For example, where the circuit configuration of the reconfigurable core 3 is to be set to the configuration 1 or the configuration 2 (in particular, where the input data is set so as to have the waveform 1 or the waveform 2), the mode [Mode] of the selectors 13, 18 and 25 is set to "0".

Further, for example, where the circuit configuration of the reconfigurable core 3 is set to the configuration 3 (in particular, where the input data is set so as to have the waveform 3), the mode [Mode] of the selectors 13, 18 and 25 is set to "1".

Further, for example, where the circuit configuration of the reconfigurable core 3 is to be set to the configuration 3 (in particular, where the input data is set so as to have the waveform 3) based on a command from the CPU 30, a controlling signal [MSB] is supplied to the second selector 17, first latch 20, and second latch 22.

It is to be noted that, where it is necessary to set control information and so forth for a different block (circuit) which configures the ASIC, also a process for the setting is performed. For example, where it is necessary to perform some setting, for example, as preparations for supply and reception of the data for the circuit (block) on the supplying side of the input data to the reconfigurable core 3 or the circuit (block) on the receiving side of the output data from the reconfigurable core 3, the process of the setting necessary for the preparations described above is performed, for example, by means of transmission of a flag signal or the like.

After such a process as described above, such a controlling process as described below is performed by the input data controlling section 4.

First, based on a command from the CPU 30, the input data (here, one of the inputs 1 to 3) necessary for the process (here, one of the processes 1 to 3) corresponding to the circuit configuration of the reconfigurable core 3 is selected by the input data selection section 1 and is supplied from a different circuit (for example, a different block which forms the ASIC) on the outside of the reconfigurable core 3. Thereafter, the selected input data is written into the input side buffer memory 2.

In this case, the CPU 30 performs starting control and ending control of supply of the input data to the circuit (block) on the side on which the input data is supplied to the reconfigurable core 3.

After writing of the input data into one of the buffer memories which configure the buffer memory 2 ends and change over between the front and back buffer memories which configure the buffer memory 2 is performed as described above, a controlling signal 36 is inputted to the data input counter 6 based on a command from the CPU 30 so that the data input counter 6 is reset and counting up is started.

Figure 6:
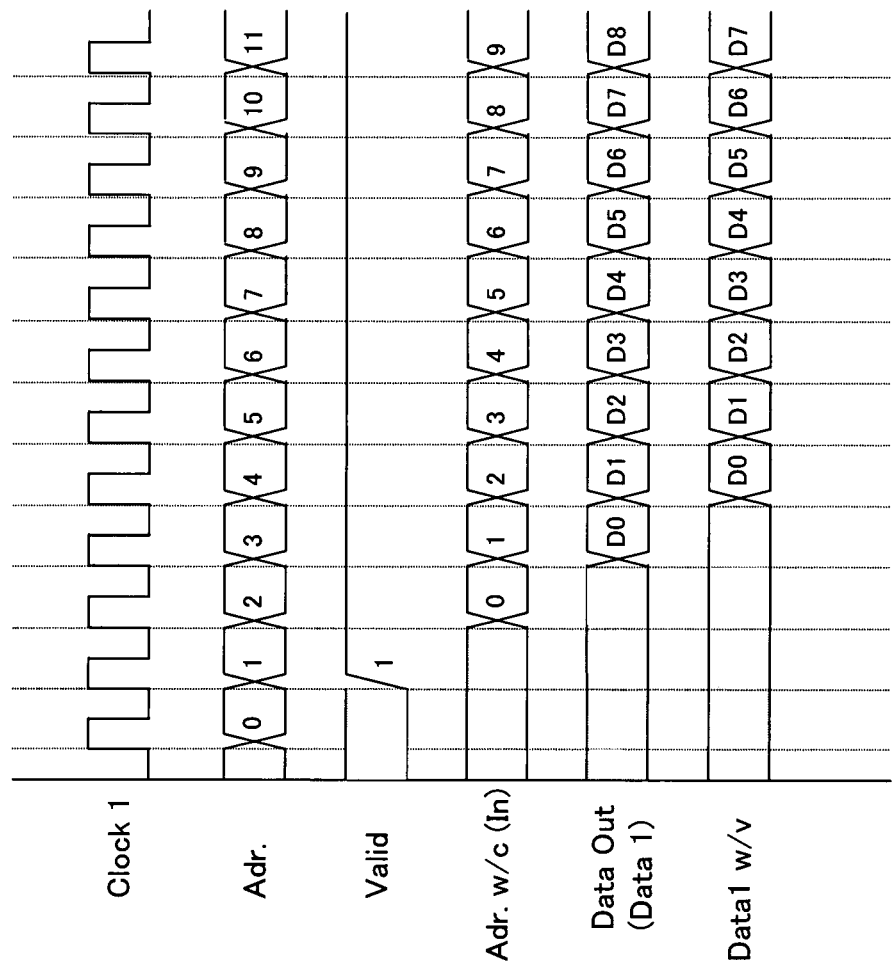
FIG. 6 is a timing chart illustrating operation where input data is set so as to have the waveform 1 by the integrated circuit according to the first embodiment of the present invention.
Figure 7:
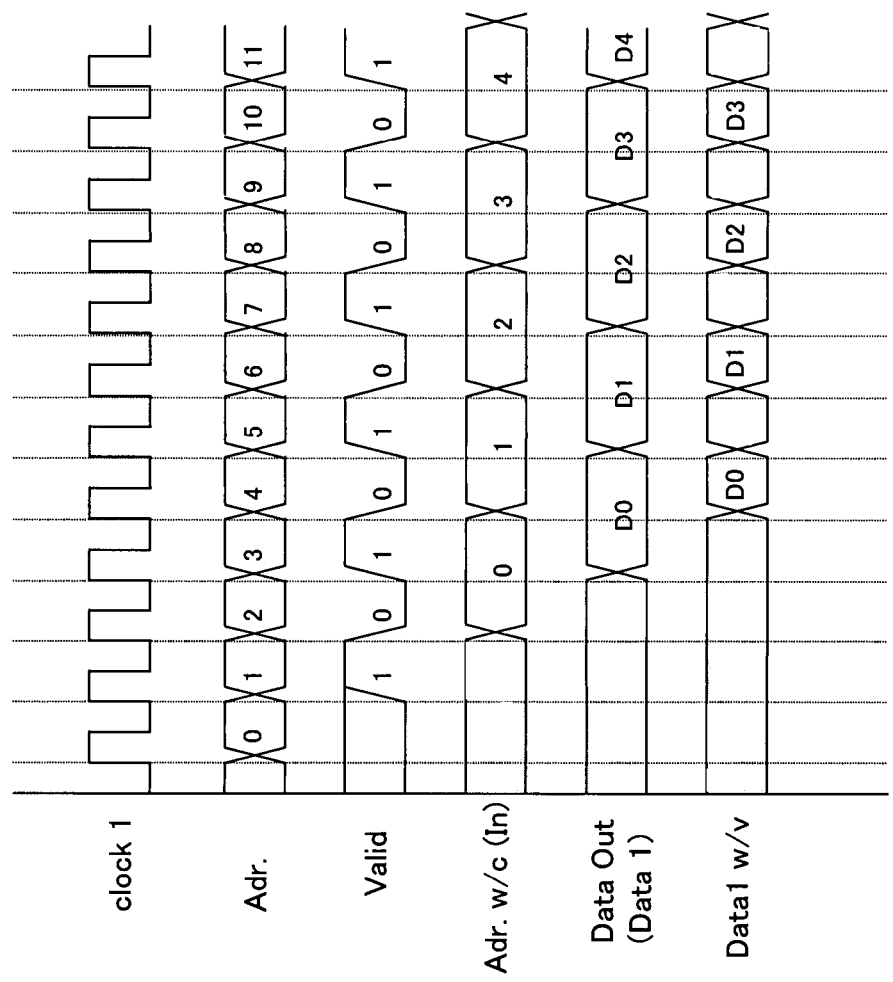
FIG. 7 is a timing chart illustrating operation where input data is set so as to have the waveform 2 by the integrated circuit according to the first embodiment of the present invention.
Figure 8:
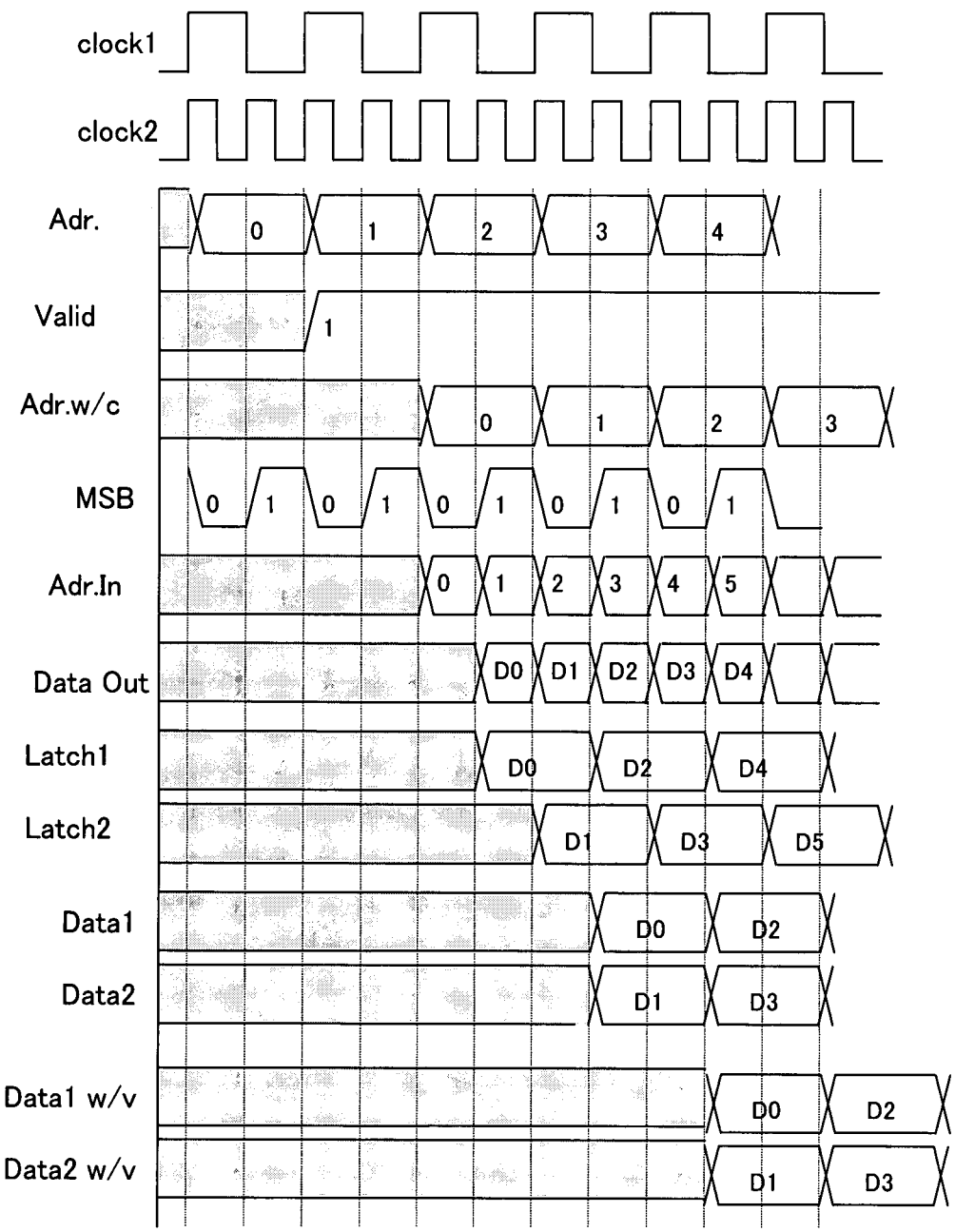
FIG. 8 is a timing chart illustrating operation where input data is set so as to have the waveform 3 by the integrated circuit according to the first embodiment of the present invention.

Here, as shown in FIGS. 6 to 8, the data input counter 6 outputs the count value (address signal; valid information extraction address value; pattern extraction address value) [Adr.] in synchronism with the clock 1 [clock 1]. Then, the address signal [Adr.] from the data input counter 6 is supplied to the RAM 5A as the data input pattern supplying section 5 (refer to FIG. 1).

Then, if the address signal [Adr.] from the data input counter 6 is received, then the RAM 5A as the data input pattern supplying section 5 supplies, based on the address signal [Adr.], the valid information [Valid] stored at the corresponding address thereof to the counter 7 with a condition decision function and the first and second input data shaping sections 9 and 10 (refer to FIG. 1). This signifies that the data input pattern configured by the valid information [Valid] is supplied (the data input pattern is extracted from the RAM 5A).

For example, where the circuit configuration of the reconfigurable core 3 is to be set to the configuration 1 or the configuration 3 (in other words, where the input data is set so as to have the waveform 1 or the waveform 3), data (data input pattern) in relationship to the valid signal [Valid] of 1, 1, . . . , 1, 1 are written in order at address 0, address 1, . . . , address 2n, and address 2n+1, respectively, of the RAM 5A as the data input pattern supplying section 5. Therefore, if the address signal [Adr.] from the data input counter 6 is counted up in order from zero as shown in FIG. 6 or FIG. 8, then the valid signal [Valid] of 1, 1, . . . , 1, 1 are supplied to the counter 7 with a condition decision function and the first and second input data shaping sections 9 and 10 (refer to FIG. 1).

Further, where the circuit configuration of the reconfigurable core 3 is to be set to the configuration 2 (in other words, where the input data is set so as to have the waveform 2), data (data input pattern) in relationship to the valid signal [Valid] of 1, 0, . . . , 1, 0 are written in order at address 0, address 1, . . . , address 2n, and address 2n+1, respectively, of the RAM 5A as the data input pattern supplying section 5. Therefore, as shown in FIG. 7, if the address signal [Adr.] from the data input counter 6 is counted up in order from zero, then the valid signal [Valid] of 1, 0, . . . , 1, 0 are supplied to the counter 7 with a condition decision function and the first and second input data shaping sections 9 and 10 (refer to FIG. 1).

Then, the counter 7 with a condition decision function receiving the valid signal [Valid] counts up if the valid signal [Valid] indicates "1" (which represents that the data is valid) (refer to [Adr.w/c] of FIGS. 6 to 8), and supplies the count value (address value, address signal; input data readout address value) [Adr.w/c] to the data parallel circuit section 8 (refer to FIG. 1). This signifies that an address value for reading out input data from the buffer memory 2 is produced based on the data input pattern.

For example, where the circuit configuration of the reconfigurable core 3 is to be set to the configuration 1 (in other words, the input data is set so as to have the waveform 1), the valid signal [Valid] of 1, 1, . . . , 1, 1 is supplied to the counter 7 with a condition decision function. Consequently, the counter 7 with a condition decision function counts up the count value thereof for each one clock of the clock 1 [clock 1] (refer to Valid and [Adr.w/c] of FIG. 6). The count value [Adr.w/c] of the counter 7 with a condition decision function is supplied to the input circuit section 11 of the data parallel circuit section 8 and is supplied as it is as the address value (address signal) [Adr.In] to the buffer memory 2 through the first selector 13 (refer to FIG. 3).

On the other hand, where the circuit configuration of the reconfigurable core 3 is to be set to the configuration 2 (in other words, the input data is set so as to have the waveform 2), the valid signal [Valid] of 1, 0, . . . , 1, 0 is supplied to the counter 7 with a condition decision function. Consequently, the counter 7 with a condition decision function counts up the count value thereof for each two clocks of the clock 1 [clock 1] (refer to [Valid] and [Adr.w/c] of FIG. 7). The count value [Adr.w/c] of the counter 7 with a condition decision function is supplied to the input circuit section 11 of the data parallel circuit section 8 and is supplied as it is as the address value (address signal) [Adr.In] to the buffer memory 2 through the first selector 13 (refer to FIG. 3).

Further, where the circuit configuration of the reconfigurable core 3 is to be set to the configuration 3 (in other words, the input data is set so as to have the waveform 3), the valid signal [Valid] of 1, 1, . . . , 1, 1 is supplied to the counter 7 with a condition decision function. Consequently, the counter 7 with a condition decision function counts up the count value thereof for each one clock of the clock 1 [clock 1] (refer to Valid and [Adr.w/c] of FIG. 8). The count value (having a desired number of bits according to the size of the buffer memory) [Adr.w/c] of the counter 7 with a condition decision function is supplied to the input circuit section 11 of the data parallel circuit section 8. Then, a process of doubling the frequency of the count value [Adr.w/c] is performed by the input circuit section 11 of the data parallel circuit section 8, and a result of the process is supplied as the address value (address signal) [Adr.In] to the buffer memory 2 (refer to FIG. 3).

In particular, the following process is executed by the input circuit section 11 of the data parallel circuit section 8.

It is to be noted that, where the input data is set so as to have the waveform 1 or the waveform 2 (where the mode [Mode] of the selectors 13, 18 and 25 is set to "0"), the buffer memory 2 operates with the clock 1 [clock 1], but where the input data is set so as to have the waveform 3 (where the mode is set to "1"), the buffer memory 2 operates with the clock 2 [clock 2] having a frequency equal to twice that of the clock 1 [clock 1].

Further, where the input data is set so as to have the waveform 1 or the waveform 2 (where the mode of the selectors 13, 18 and 25 is set to "0"), the data parallel circuit section 8 reads out data from the buffer memory 2 in synchronism with the clock 1 [clock 1] and supplies the read out data to the first input data shaping section 9. However, where the input data is set so as to have the waveform 3 described hereinabove (where the mode is set to "1"), the data parallel circuit section 8 reads out data from the buffer memory 2 in synchronism with the clock 2 [clock 2] having a frequency equal to twice that of the clock 1 [clock 1] and supplies the readout data to the first input data shaping section 9 and the second input data shaping section 10.

First, the address signal [Adr.w/c] supplied from the counter 7 with a condition decision function is branched into two signals, one of which is supplied to the shifter 15 and the other of which is supplied to the first selector 13.

Then, a process of shifting (doubling) the count value by one bit leftward is performed by the shifter 15. Then, the count value processed by the shifter 15 is further branched into two signals, one of which is supplied to the adder 16 and the other of which is supplied to the second selector 17 as seen in FIG. 3.

Then, a process of adding "1" to the count value processed by the shifter 15 is performed by the adder 16. Then, the count value processed by the adder 16 is supplied to the second selector 17 as seen in FIG. 3.

Thereafter, as seen in FIG. 3, if the controlling signal [MSB] is "0", then the count value supplied from the shifter 15 is selected by the second selector 17, but if the controlling signal [MSB] is "1", then the count value supplied from the adder 16 is selected by the second selector 17. Then, the selected count value is supplied to the first selector 13.

Here, since a signal which varies like 0, 1, 0, 1, . . . , in response to a rising edge of the clock 2 [clock 2] is supplied as the controlling signal [MSB] to the second selector 17 as seen in FIG. 8, the count value supplied from the shifter 15 and the count value supplied from the adder 16 are selected alternately in synchronism with the clock 2 [clock 2]. As a result, the address signal (count value of the counter 7 with a condition decision function) [Adr.w/c] which is synchronized with the clock 1 [clock 1] is converted into an address value (address signal) [Adr.In] which is synchronized with the clock 2 [clock 2] which has a frequency equal to twice that of the clock 1 [clock 1].

Then, as seen in FIG. 3, if the mode [Mode] is "0", then the count value [Adr.w/c] supplied from the counter 7 with a condition decision function is selected by the first selector 13, but if the mode [Mode] is "1", then the count value supplied through the second selector 17 (address signal which is synchronized with the clock 2 [clock 2] having a frequency equal to twice that of the clock 1 [clock 1]) is selected by the first selector 13. Then, the selected value is outputted as the address value [Adr.In].

For example, where the circuit configuration of the reconfigurable core 3 is set to the configuration 1 (that is, where the input data is set so as to have the waveform 1), since the mode of the first selector 13 is set to "0", the address value [Adr.w/c] supplied from the counter 7 with a condition decision function is supplied as it is as the address value [Adr.In] to the buffer memory 2 through the first selector 13 (refer to FIG. 6).

On the other hand, where the circuit configuration of the reconfigurable core 3 is set to the configuration 2 (that is, where the input data is set so as to have the waveform 2), since the mode of the first selector 13 is set to "0", the address value [Adr.w/c] supplied from the counter 7 with a condition decision function is supplied as it is as the address value [Adr.In] to the buffer memory 2 through the first selector 13 (refer to FIG. 7).

Further, where the circuit configuration of the reconfigurable core 3 is set to the configuration 3 (that is, where the input data is set so as to have the waveform 3), since the mode of the first selector 13 is set to "1", the count value supplied through the second selector 17 (address signal synchronized with the clock 2 [clock 2] having a frequency equal to twice that of the clock 1 [clock 1]) is supplied as the address value [Adr.In] to the buffer memory 2 through the first selector 13 (refer to FIG. 8).

Then, as seen in FIG. 3, input data [Data Out] is supplied from the buffer memory 2 to the output circuit section 12 of the data parallel circuit section 8 based on the address value (address signal) [Adr.In] supplied through the input circuit section 11 of the data parallel circuit section 8.

In the present embodiment, the output circuit section 12 of the data parallel circuit section 8 performs the following process.

First, as seen in FIG. 3, the input data [Data Out] supplied from the buffer memory 2 is branched into two data, one of which is supplied to the third selector 18 and the other one of which is supplied to the data production circuit section 19.

The data production circuit section 19 further branches the input data [Data Out] into two data, one of which is supplied to the first latch 20 and the other one of which is supplied to the second latch 22.

Here, if the controlling signal [MSB] is "1", then the first latch 20 passes the input data [Data Out] supplied thereto, but if the controlling signal [MSB] is "0", then the first latch 20 retains the data. On the other hand, the second latch 22 passes the input data [Data Out] supplied thereto if the controlling signal [MSB] is "0", but retains the data if the controlling signal [MSB] is "1".

Here, the controlling signal [MSB] is a control signal for distributing the input data [Data Out] to the input data [Data1] and [Data2]. Here, the controlling signal [MSB] which varies like 1, 0, 1, 0, . . . in synchronism with a rising edge of the clock 2 [clock 2] as seen in FIG. 8 is supplied from the buffer memory 2 to the first latch 20 and the second latch 22. It is to be noted that alternatively an inverted signal of the clock 1 [clock 1] may be used as the controlling signal [MSB].

Therefore, from among the input data [Data Out] supplied from the buffer memory 2 through the third selector 18, the data [D0, D2, D4, . . . ] supplied on every odd-numbered turn passes through the first latch 20, but the data [D1, D3, D5, . . . ] supplied on every even-numbered turn passes through the second latch 22. Further, each of the latches 20 and 22 retains, after it passes each data supplied thereto in synchronism with the clock 2 [clock 2], the data for a period of time of one clock of the clock 2 [clock 2]. Therefore, the data [Latch1] and [Latch2] outputted from the latches 20 and 22, respectively, have a frequency (clock 1 [clock 1]) equal to one half that of the clock 2 [clock 2] as seen in FIG. 8.

Then, as seen in FIG. 8, the data [Latch1] and [Latch2] outputted from the latches 20 and 22 are read into the first and second registers 21 and 23, respectively, in synchronism with a falling edge of the clock 1 [clock 1]. The data read in the first register 21 is supplied to the third selector 18 while the data read in the second register 23 is supplied as input data [Data2] to the second input data shaping section 10 (refer to FIG. 3).

Then, as seen in FIG. 3, if the mode [Mode] is "0", then the input data [Data Out] supplied from the buffer memory 2 is selected by the third selector 18, but if the mode is "1", then the data supplied form the first register 21 is selected. The selected data is supplied as the input data [Data1] to the first input data shaping section 9.

For example, where the circuit configuration of the reconfigurable core 3 is set to the configuration 1 or the configuration 2 (that is, where the input data is set so as to have the waveform 1 or the waveform 2), the mode of the third selector 18 is set to "0". Therefore, the input data [DataOut] supplied from the buffer memory 2 is supplied as it is as the input data [Data1] to the first input data shaping section 9 through the third selector 18 (refer to FIG. 6 or 7).

On the other hand, where the circuit configuration of the reconfigurable core 3 is set to the configuration 3 (that is, where the input data is set so as to have the waveform 3), since the mode of the third selector 18 is set to "1" as seen in FIG. 3, the data processed in such a manner as described hereinabove is supplied as the input data [Data1] to the first input data shaping section 9 (refer to FIG. 8).

Then, as seen in FIG. 1, the input data [Data1] and [Data2] are shaped by adding the valid information [Valid] thereto by the first input data shaping section 9 and the second input data shaping section 10 and supplied as input data [Data1 w/v] and [Data2 w/v] to the reconfigurable core 3, respectively.

For example, where the circuit configuration of the reconfigurable core 3 is set to the configuration 1 or the configuration 2 (that is, where the input data is set so as to have the waveform 1 or the waveform 2), the valid information [Valid] supplied from the RAM 5A as the data input pattern supplying section 5 (here, the valid information [Valid] is supplied after a delay by 3 clocks with respect to the valid signal supplied to the counter 7 with a condition decision function) is added to the input data [Data1] supplied from the data parallel circuit section 8 by the first input data shaping section 9 as seen in FIG. 1. Consequently, the input data [Data1] is shaped in accordance with the circuit configuration of the reconfigurable core 3 and outputted as the input data [Data1 w/v] to the reconfigurable core 3 (refer to FIG. 6 or 7).

In this manner, data is inputted to the reconfigurable core 3 at such a timing as seen from the waveform 1 of FIG. 2(A) or the waveform 2 of FIG. 2(B).

Incidentally, in the present embodiment, the valid information [Valid] is supplied to the second input data shaping section 10 through the selector 25 as seen in FIG. 1.

Then, where the circuit configuration of the reconfigurable core 3 is set to the configuration 1 or the configuration 2 (that is, where the input data is set so as to have the waveform 1 or the waveform 2), the mode of the selector 25 is set to "0". Where the mode is "0", the fixed value "0" is supplied as the valid signal [Valid] to the second input data shaping section 10 through the selector 25.

Therefore, the valid information [Valid] "0" is added to the input data [Data2] supplied from the data parallel circuit section 8 (that is, all input data [Data2] are invalidated) by the second input data shaping section 10, and resulting data is outputted as the input data [Data2 w/v] to the reconfigurable core 3.

On the other hand, where the circuit configuration of the reconfigurable core 3 is set to the configuration 3 (that is, where the input data is set so as to have the waveform 3 described hereinabove), the mode of the selector 25 is set to "1". Where the mode is "1", the valid information [Valid] supplied from the RAM 5A as the data input pattern supplying section 5 is supplied to the second input data shaping section 10 through the selector 25 (here, the valid information [Valid] is supplied after a delay of 3 clocks with respect to the valid signal supplied to the counter 7 with a condition decision function).

Therefore, the valid information [Valid] supplied from the RAM 5A as the data input pattern supplying section 5 (here, the valid information [Valid] is supplied after a delay by 3 clocks with respect to the valid signal supplied to the counter 7 with a condition decision function) is added to the input data [Data1] and [Data2] supplied from the data parallel circuit section 8 by the first input data shaping section 9 and the second input data shaping section 10 as seen in FIG. 1. Consequently, the input data [Data1] and [Data2] are shaped in accordance with the circuit configuration of the reconfigurable core 3 and supplied as the input data [Data1 w/v] and [Data2 w/v] (refer to FIG. 8) to the reconfigurable core 3.

In this manner, data is inputted to the reconfigurable core 3 at such a timing as seen from the waveform 3 of FIG. 2(C).

Thereafter, data which is processed by the reconfigurable core 3 and is to be outputted to another circuit (for example, another block which configures the ASIC) is retained once into the buffer memory 32 of the output side as seen in FIG. 5. Then, the output data retained in the output side buffer memory 32 is supplied (outputted) to a circuit on the side which is to receive the output data from the reconfigurable core 3 based on a command from the CPU 30.

In this instance, the CPU 30 performs control (starting control and ending control) for the circuit on the side which is to receive the data outputted from the reconfigurable core 3, which is necessary to receive the output data from the output side buffer memory 32.

It is to be noted that, while, in the present embodiment, the input data selection section 1, input side buffer memory 2, input data controlling section 4, reconfigurable core 3, output side buffer memory 32 and RAM 31 are controlled by the CPU 30, they need not necessarily be controlled by the CPU 30 but may be controlled by a control circuit (controller) such as, for example, a processor for exclusive use.

Accordingly, with the integrated circuit and the input data controlling method for a reconfigurable circuit according to the present embodiment, there is an advantage that input data can be processed with certainty by the reconfigurable core 3.

[Second Embodiment]

Now, an integrated circuit and an input data controlling method for a reconfigurable circuit according to a second embodiment of the present invention are described with reference to FIG. 9.

The integrated circuit according to the present embodiment is different from that of the first embodiment described hereinabove in configuration of the data input pattern supplying section.

In particular, in the present embodiment, the data input pattern supplying section 5 is configured by a pattern generation circuit (valid information generation circuit) 5B which generates a data input pattern (valid information). It is to be noted that, in FIG. 9, like elements to those of the first embodiment described hereinabove (refer to FIG. 1) are denoted by like reference characters.

Such a configuration as described above is suitably applied, for example, where it is not desired to use a RAM which requires a comparatively high area cost or where the input timing of data is simple, and the data input pattern supplying section 5 can be designed using only simpler logic elements.

Figure 9:
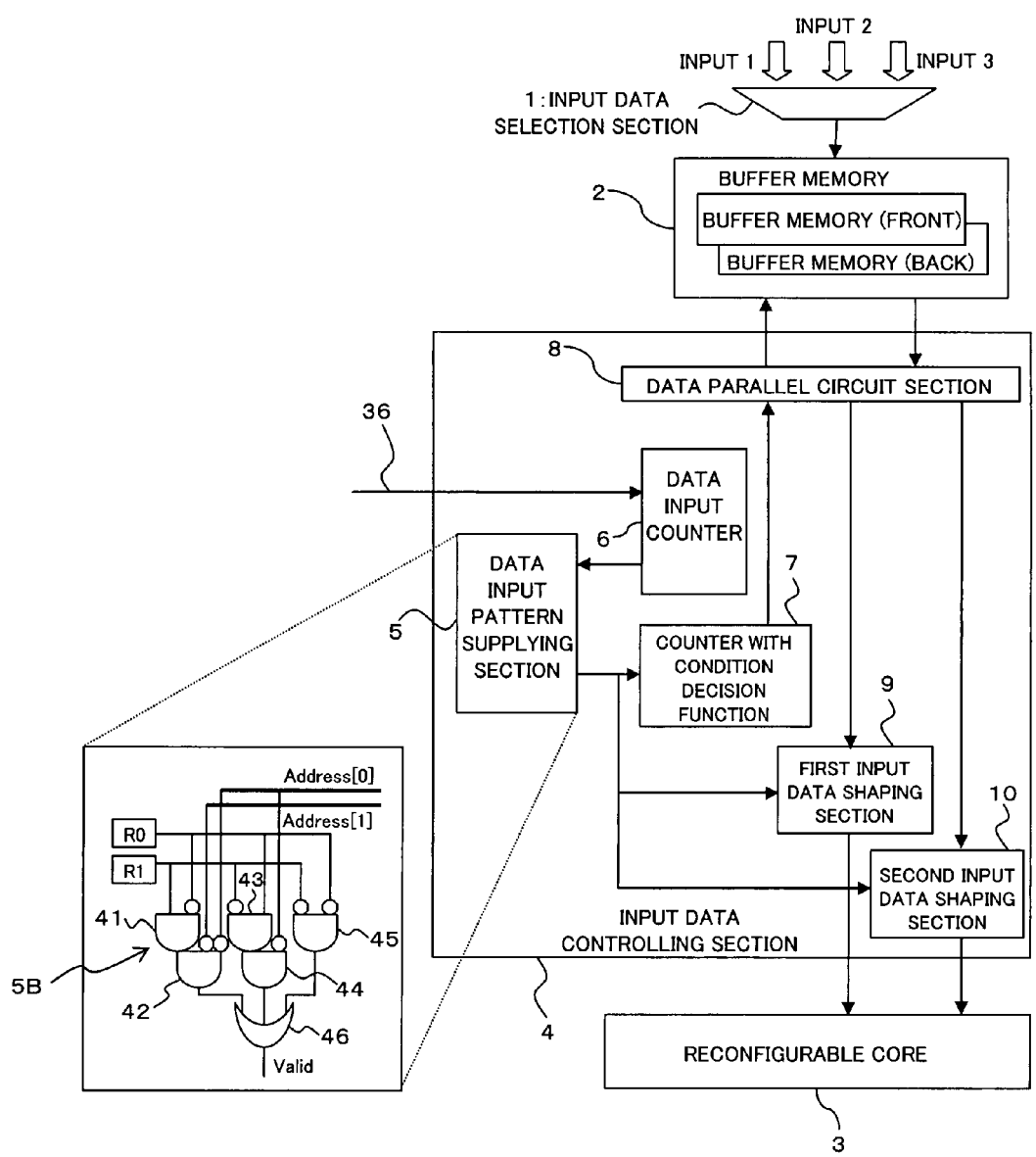
FIG. 9 is a schematic view showing a configuration of an integrated circuit according to a second embodiment of the present invention.

Here, the pattern generation circuit 5B which can change over among three data input patterns, that is, a 1-data 1-clock pattern, a 1-data 2-clock pattern and a 1-data 4-clock pattern, is described as an example with reference to FIG. 9.

The pattern generation circuit 5B is configured including two registers R0 and R1, five AND circuits 41 to 45 and one OR circuit 46 as seen in FIG. 9.

The registers R0 and R1 are registers of the type which can be controlled from the outside (for example, a CPU). In particular, the values of the registers R0 and R1 (control information for defining a data input pattern) can be controlled from the outside (for example, a CPU) and can be varied in accordance with the circuit configuration of the reconfigurable core 3.

Further, the present pattern generation circuit 5B uses only two low-order bits of the count value (address value, address signal; valid information extraction address value; pattern extraction address value) [Adr.] supplied from the data input counter 6.

In other words, the value of the lowest-order bit of the address value [Adr.] supplied from the data input counter 6 is inputted to the address bus indicated by Address [0] of the pattern generation circuit 5B. Meanwhile, the value of the second lowest-order bit of the address value [Adr.] supplied from the data input counter 6 is inputted to the address bus indicated by Address [1].

In the pattern generation circuit 5B configured in such a manner as described above, if the values of the registers are set to R0=0 and R1=0, then data is supplied every one clock, but if the values are set to R0=1 and R1=0, then data is supplied every two clocks, and if the values are set to R0=0 and R1=1, then data is supplied every four clocks.

In particular, if the values of the registers of the pattern generation circuit 5B are set to R0=0 and R1=0, then a data input pattern (input timing information) which defines an input timing for supplying data every one clock is produced (that is, valid information [Valid] of 1, 1, . . . , 1, 1 is produced) and is supplied to the counter 7 with a condition decision function, first input data shaping section 9 and second input data shaping section 10. Consequently, the input data can be set so as to have the waveform 1 or the waveform 3 (refer to FIG. 2(A) or 2(C)).

On the other hand, if the values of the registers of the pattern generation circuit 5B are set to R0=1 and R1=0, then a data input pattern which defines an input timing for supplying data every two clocks is produced (that is, valid information [Valid] of 1, 0, . . . , 1, 0 is produced) and is supplied to the counter 7 with a condition decision function, first input data shaping section 9 and second input data shaping section 10. Consequently, the input data can be set so as to have the waveform 2 described hereinabove [refer to FIG. 2(B)].

Further, if the values of the registers of the pattern generation circuit 5B are set to R0=0 and R1=1, then a data input pattern (input timing information) which defines an input timing for supplying data every four clocks is produced (that is, valid information [Valid] of 1, 0, 0, 0, . . . , 1, 0, 0, 0 is produced) and is supplied to the counter 7 with a condition decision function, first input data shaping section 9 and second input data shaping section 10.

It is to be noted that, since the valid signal [Valid] is produced by the data input counter 6 and the pattern generation circuit 5B as the data input pattern supplying section 5 (which are collectively referred to as data input pattern supplying circuit), they are referred to also as Valid production section (Valid production circuit).

It is to be noted that, although the registers R0 and R1 here are used to set a data input pattern, they need not necessarily be used, but, for example, a control signal from another circuit (block) may be used in place of the registers.

Since the configuration and the operation of the other part are same as those of the first embodiment and the modification to the first embodiment described hereinabove, description of them is omitted herein.

Accordingly, with the integrated circuit and the input data controlling method for a reconfigurable circuit according to the present embodiment, there is an advantage that input data can be processed with certainty by the reconfigurable core similarly to that of the first embodiment described hereinabove.

[Third Embodiment]

Now, an integrated circuit and an input data controlling method for a reconfigurable circuit according to a third embodiment of the present invention are described with reference to FIGS. 10(A) and 10(B).

The integrated circuit according to the present embodiment is different from those of the first and second embodiments described hereinabove in configuration of the data input pattern supplying section.

Figure 10A:
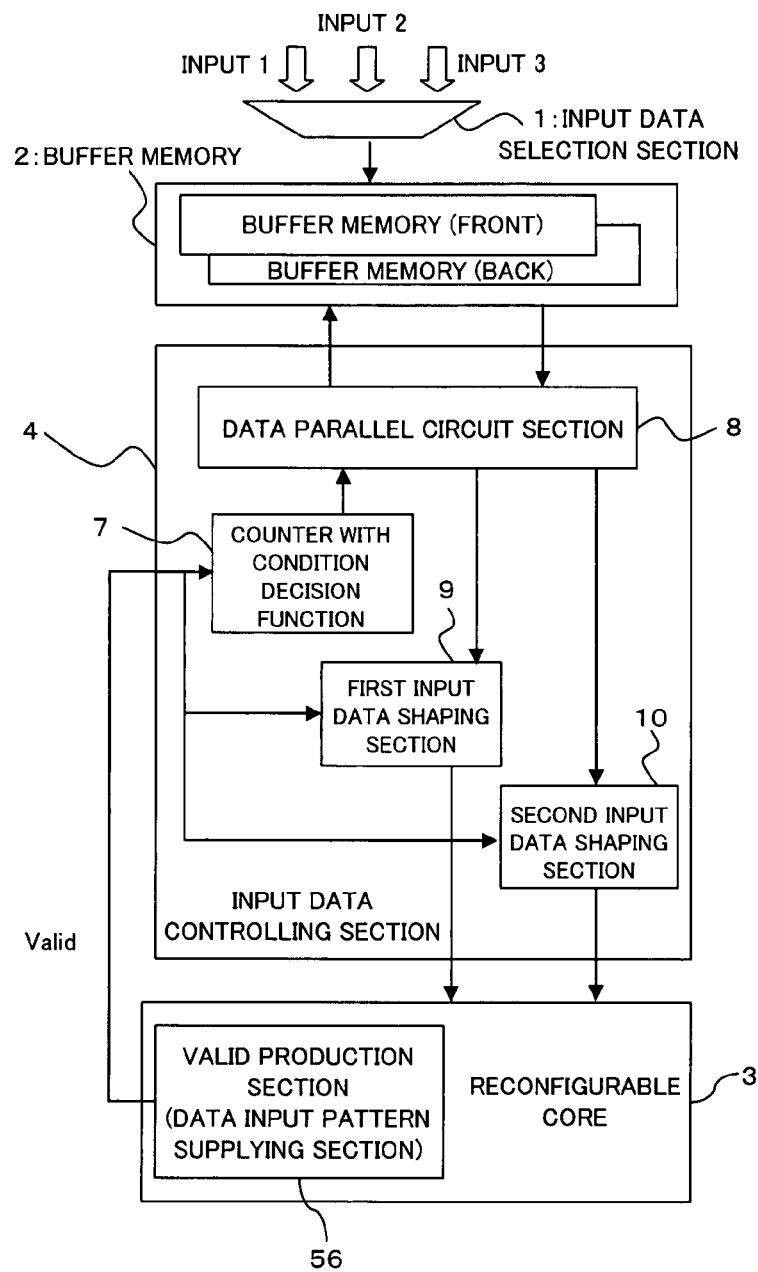
FIGS. 10(A) and 10(B) are schematic views showing a configuration of an integrated circuit according to a third embodiment of the present invention.

In particular, while, in the first and second embodiments described hereinabove, the data input pattern supplying section 5 is implemented by some hardware, in the present integrated circuit, the configuration corresponding to the data input pattern supplying section 5 and the data input counter 6 in the first and second embodiments [that is, Valid production section for producing valid signal [Valid] (flag information; flag signal of whether or not data should be supplied) to be supplied to the counter 7 with a condition decision function] is implemented using part of the reconfigurable core 3 as seen in FIG. 10(A). It is to be noted that like elements to those of the first embodiment (refer to FIG. 1) described hereinabove are denoted by like reference characters.

Therefore, the present integration circuit is configured such that, as seen in FIG. 10(A), a Valid production section (flag information production section, data input pattern supplying circuit) 56 is configured using a circuit composed of some of the computing units of there configurable core 3 and valid information [Valid] (data input pattern) produced by the Valid production section 56 is supplied to the counter 7 with a condition decision function, first input data shaping section 9 and second input data shaping section 10 of the input data controlling section 4.

Figure 10B:
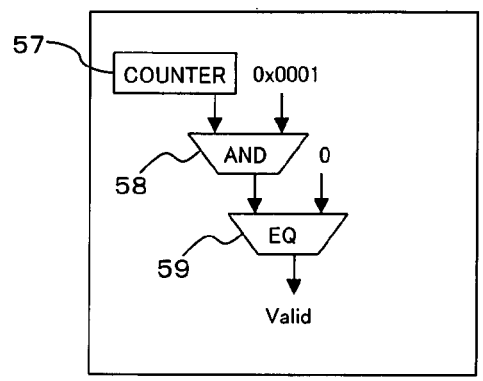

In the present embodiment, the Valid production section 56 is configured as a circuit (Valid production circuit) which includes, for example, as shown in FIG. 10(B), a counter 57, an AND circuit 58, and a comparator (EQ) 59. It is to be noted that the configuration of the Valid production section 56 is not limited to this.

The AND circuit (ALU) 58 ANDs a count value from the counter 57, which counts up from 0 to an arbitrary value, and the fixed value "1" (0x0001) (bit and) and extracts and outputs only the lowest-order one bit.

The comparator (EQ; equalizer; ALU) 59 compares the value extracted by the AND circuit 58 and the fixed value "0" and outputs "1" when the two values coincide with each other (that is, when the value extracted by the AND circuit 58 is "0").

Since the Valid production section 56 configured in this manner produces "1" as the valid signal [Valid] when the count value of the counter 57 is an even number, the valid signal [Valid] is 1, 0, . . . , 1, 0. In other words, a data input pattern (input timing information) which defines an input timing for supplying one data per two clocks is produced. Consequently, the input data can be set so as to have the waveform 2 [refer to FIG. 2(B)] with which one data is inputted per two clocks.

It is to be noted that, while the Valid production section 56 here is configured as a circuit which produces valid information [Valid] for setting the input data so as to have the waveform 2 [refer to FIG. 2(B)], the configuration of the Valid production section 56 is not limited to this. For example, the Valid production section 56 may be configured as a circuit which produces valid information [Valid] for setting the input data so as to have the waveform 1 or the waveform 3 [refer to FIG. 2(A) or 2(C)].

In this instance, the Valid production section 56 may be configured, for example, by an AND circuit having two input terminals, to both of which the fixed value "1" is inputted. Where the configuration just described is employed, "1" is successively produced as the valid signal [Valid] (that is, valid information [Valid] of 1, 1, . . . , 1, 1 is produced). In other words, a data input pattern (input timing information) which defines an input timing for supplying one data per one clock is produced. Consequently, the input data can be set so as to have the waveform 1 or the waveform 3 [refer to FIG. 2(A) or 2(C)].

It is to be noted that, since the configuration and the operation of the other part are same as those of the first and second embodiments and the modification to them described hereinabove, description of them is omitted herein.

Accordingly, with the integrated circuit and the input data controlling method for a reconfigurable circuit according to the present embodiment, there is an advantage that input data can be processed with certainty by the reconfigurable core similarly as in those of the first and second embodiments described hereinabove.

[Others]

It is to be noted that the present invention is not limited to the embodiments specifically described above, and variations and modifications can be made without departing from the scope of the present invention.

For example, the configuration and operation of the input data controlling section 4 are not limited to those of the embodiments described hereinabove, but the input data controlling section 4 may be configured such that data is inputted in accordance with the circuit configuration of the reconfigurable core (reconfigurable circuit) 3.

Further, while, in the embodiments described hereinabove, input data are set so as to have the waveforms 1 to 3 in accordance with the processes 1 to 3, respectively, any configuration may be used only if data is inputted in accordance with the circuit configuration of the reconfigurable core 3 so that the process can be performed by the reconfigurable core 3.

For example, while, in the embodiments described hereinabove, description of a case wherein input data is set so as to have the waveform 2 and description of another case wherein input data is set so as to have the waveform 3 are given separately from each other, where the input data is set so as to have the waveform 3 (where different data are inputted to the two ports of the reconfigurable core 3), also it is possible to apply a data input pattern [data input pattern wherein data is inputted after every interval of time corresponding to a period of time required for changing over the resource (circuit configuration)] for setting the input data so as to have the waveform 2.

Further, for example, the embodiments described above are configured such that the process 3 is set so as to process two data in one clock and the waveform 3 is set as a waveform with which one data is inputted per one clock to each of the two ports of the reconfigurable core 3 while the data parallel circuit section 8 produces the input data [Data1] and [Data2] as the input data [Data Out] and the first input data shaping section 9 and the second input data shaping section 10 are provided. This configuration is not essentially required, but another configuration may be employed wherein, for example, the process 3 is set so as to process a plurality of data in one clock and the waveform 3 is set as a waveform with which data is inputted to each of a plurality of ports of the reconfigurable core while the data parallel circuit section produces a plurality of input data as the input data [Data Out] and a plurality of input data shaping sections (input data shaping circuits) are provided.

Figure 11:
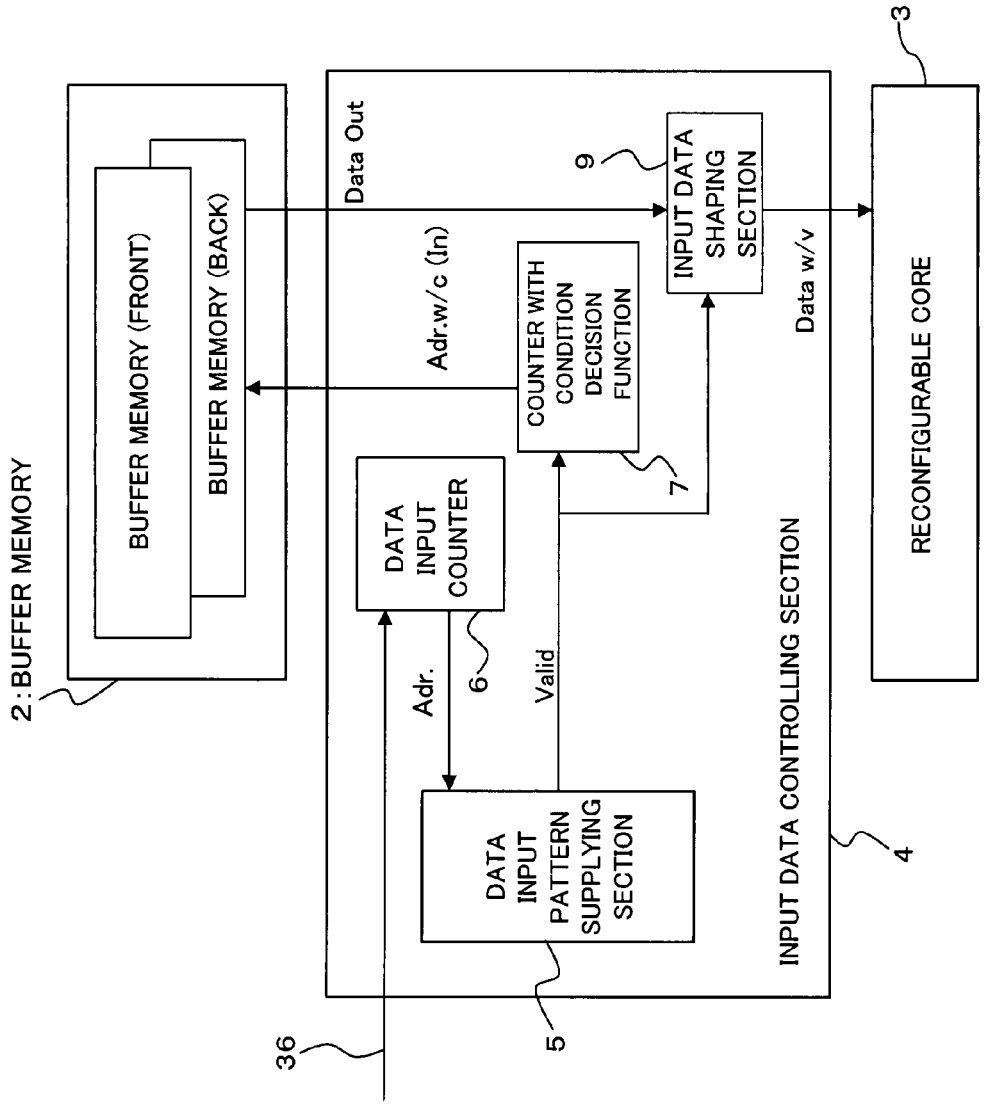
FIGS. 11 and 12 are schematic views showing configurations of different modifications to the integrated circuits according to the embodiments of the present invention.

Further, while, in the embodiments described hereinabove, the data parallel circuit section 8 is provided, this configuration is not essentially required. For example, where only it is necessary to set the circuit configuration of the reconfigurable core 3 to the configuration 1 or the configuration 2 (that is, to set the input data so as to have the waveform 1 or the waveform 2), the integrated circuit can be configured without including a data parallel circuit section, for example, as shown in FIG. 11. In this instance, it is necessary to provide only one input data shaping section.

Figure 12:
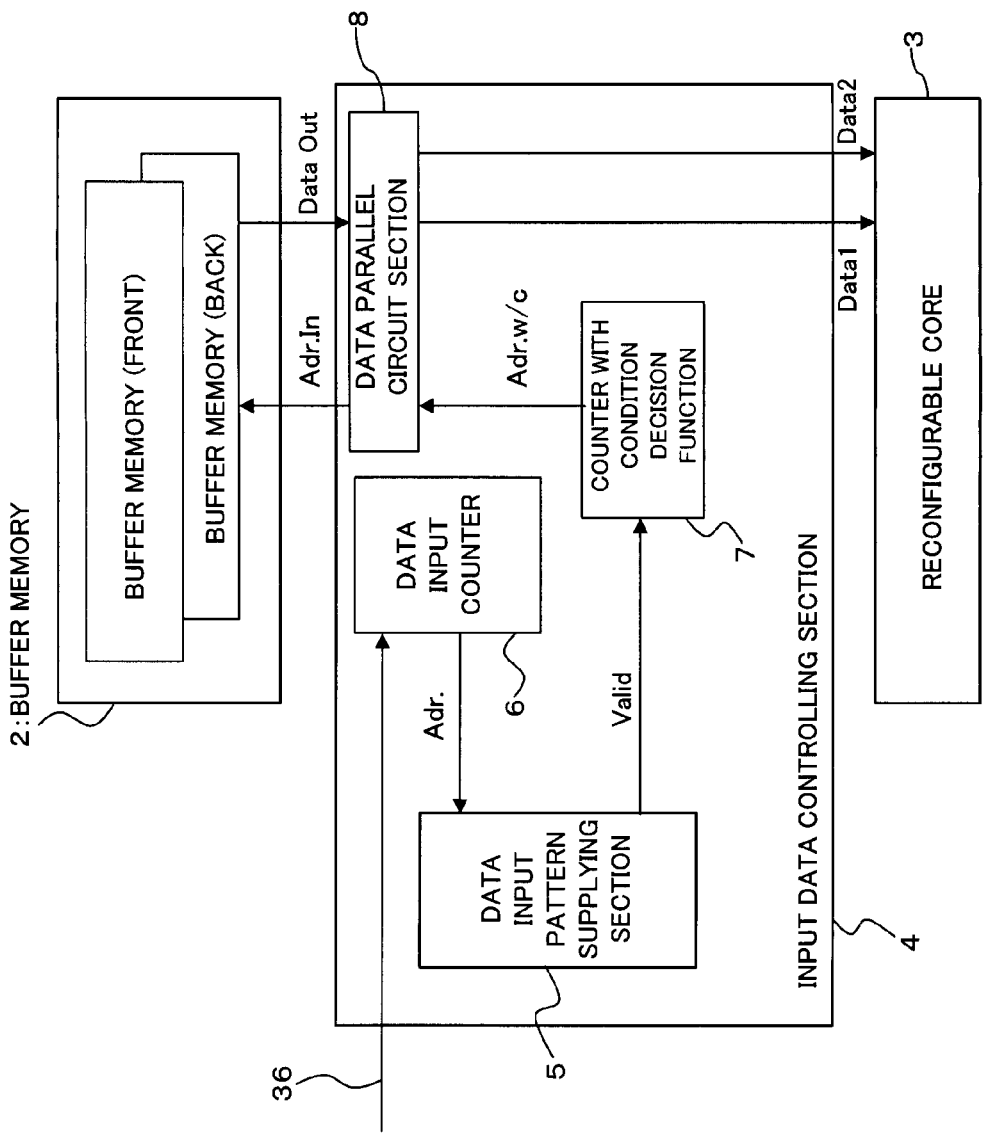
Figure 13A:
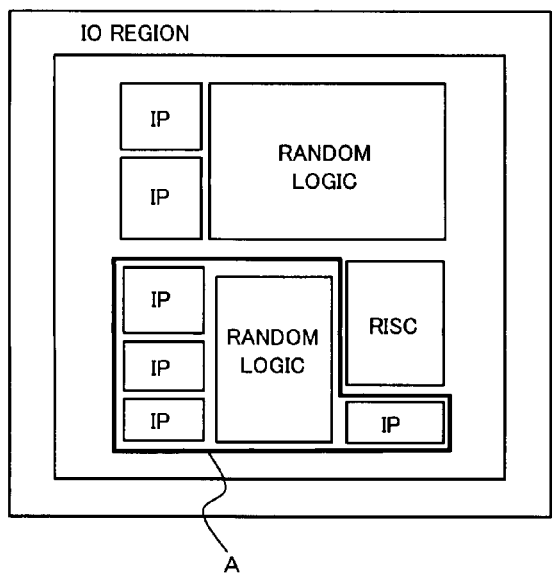
FIG. 13(A) is a schematic view showing an example of a configuration of a conventional ASIC.
Figure 13B:
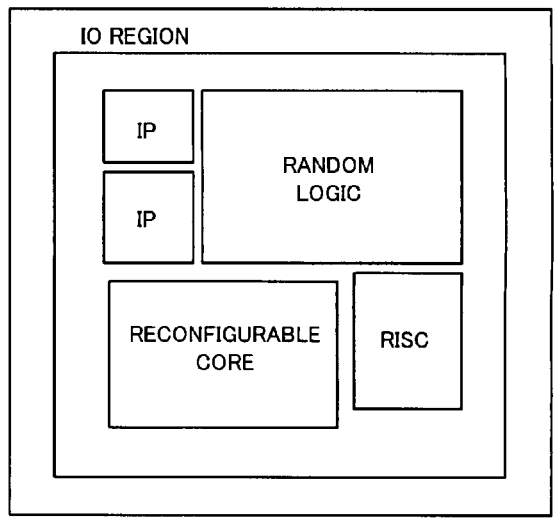
FIG. 13(B) is a schematic view showing an example of a configuration where a reconfigurable core is placed in part of an ASIC.
Figure 13C:
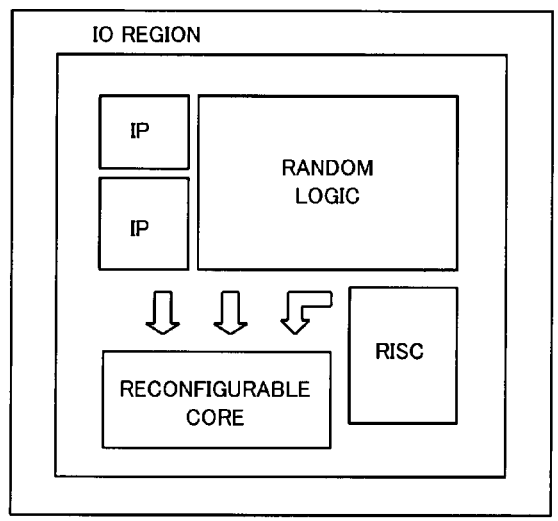
FIG. 13(C) is a schematic view illustrating a subject where the reconfigurable core is placed in part of the ASIC.

Further, while, in the embodiments described hereinabove, the input data shaping section is provided, this configuration is not essentially required. For example, where only it is necessary to set the circuit configuration of the reconfigurable core 3 to the configuration 1 or the configuration 3 (that is, to set the input data so as to have the waveform 1 or the waveform 3), the integrated circuit can be configured without including an input data shaping section, for example, as shown in FIG. 12.

Further, in the embodiments described hereinabove, the present invention is applied to a configuration wherein, for example, the reconfigurable core (reconfigurable circuit) 3 is incorporated in an ASIC. However, the present invention is not limited to this but can be applied widely to integrated circuits which include a reconfigurable circuit including a plurality of computing units interconnected in a reconfigurable manner.

What is claimed is:

1. An integrated circuit, comprising:
   a dynamic reconfigurable circuit including a plurality of computing units interconnected in a reconfigurable manner, the dynamic reconfigurable circuit being capable of dynamically changing a circuit configuration thereof by changing over interconnections interconnecting the plurality of computing units, while the dynamic reconfigurable circuit operates, from a first circuit configuration to implement a first function to a second circuit configuration to implement a second function different from the first function;
   a plurality of circuit blocks; and
   an input data controlling section configured to control at least one of a configuration and an input timing of input data supplied from each of the plurality of circuit blocks in response to the first circuit configuration or the second circuit configuration of the dynamic reconfigurable circuit, and to input the controlled input data to the dynamic reconfigurable circuit;
   wherein the integrated circuit is an application specific integrated circuit (ASIC), and
   the plurality of circuit blocks include a hardware intellectual property (IP) block, a random logic block and a reduced instruction set computer (RISC) processor block.

2. The integrated circuit as claimed in claim 1, wherein the input data controlling section includes a data input pattern supplying section configured to supply a data input pattern which defines an input timing in response to the first circuit configuration or the second circuit configuration of the dynamic reconfigurable circuit.

3. The integrated circuit as claimed in claim 2, further comprising a buffer memory to temporarily retain the input data; and wherein
   the data input pattern supplying section is configured by a random access memory to store the data input pattern, and
   the input data controlling section includes a counter to produce an address value for accessing the random access memory and a counter with a condition decision function to produce another address value for reading out the input data from the buffer memory based on the data input pattern read out from the random access memory.

4. The integrated circuit as claimed in claim 2, further comprising a buffer memory to temporarily retain the input data; and wherein
   the data input pattern supplying section is configured by a pattern generation circuit to generate the data input pattern, and
   the input data controlling section includes a counter to produce an address value to be inputted to the pattern generation circuit and a counter with a condition decision function to produce another address value for reading out the input data from the buffer memory based on the data input pattern supplied from the pattern generation circuit.

5. The integrated circuit as claimed in claim 2, further comprising a buffer memory to temporarily retain the input data; and wherein
   the data input pattern supplying section is configured by the computing units of the dynamic reconfigurable circuit, and
   the input data controlling section includes a counter with a condition decision function to produce an address value for reading out the input data from the buffer memory based on the data input pattern supplied from the data input pattern supplying section.

6. The integrated circuit as claimed in claim 1, wherein the input data controlling section includes a data parallel circuit section configured to divide the input data in parallel.

7. The integrated circuit as claimed in claim 1, wherein the data input pattern supplying section is configured so as to supply valid information which constitutes the data input pattern; and
   the input data controlling section includes an input data shaping section configured to shape the input data by adding the valid information to the input data.

8. An input data controlling method for a dynamic reconfigurable circuit, the input data controlling method comprising:
   extracting a data input pattern which defines an input timing in response to a circuit configuration of the dynamic reconfigurable circuit which includes a plurality of computing units interconnected in a reconfigurable manner, the circuit configuration of the dynamic reconfigurable circuit being dynamically changed by changing over interconnections interconnecting the plurality of computing units, while the dynamic reconfigurable circuit operates, from a first circuit configuration to implement a first function to a second circuit configuration to implement a second function different from the first function; and
   inputting input data supplied from each of a plurality of circuit blocks to the dynamic reconfigurable circuit based on the data input pattern;

wherein the dynamic reconfigurable circuit and the plurality of circuit blocks are provided in an application specific integrated circuit (ASIC), and the plurality of circuit blocks include a hardware intellectual proprerty (IP) block, a random logic block and a reduced instruction set computer (RISC) processor block.

9. The input data controlling method as claimed in claim 8, further comprising:

writing the input data into a buffer memory;

producing an input data readout address value for reading out the input data from the buffer memory based on the data input pattern; and reading out the input data from the buffer memory based on the input data readout address value and inputting the input data to the dynamic reconfigurable circuit.

10. The input data controlling method as claimed in claim 8, further comprising:

producing a pattern extraction address value for accessing a random access memory in which the data input pattern is stored; and extracting the data input pattern from the random access memory based on the pattern extraction address value.

11. The input data controlling method as claimed in claim 8, further comprising:

producing a pattern extraction address value to be inputted to a pattern generation circuit to generate the data input pattern; and extracting the data input pattern from the pattern generation circuit based on the pattern extraction address value.

12. The input data controlling method as claimed in claim 8, further comprising extracting a data input pattern produced using the computing units of the dynamic reconfigurable circuit.

13. The input data controlling method as claimed in claim 8, further comprising dividing the input data in parallel and inputting the divided input data to the dynamic reconfigurable circuit.

14. The input data controlling method as claimed in claim 8, further comprising:

extracting a data input pattern constituted by valid information as the data input pattern; and shaping the input data by adding the valid information to the input data.

* * * * *